United States Patent
Iwashita et al.

(10) Patent No.: US 7,565,724 B2
(45) Date of Patent: Jul. 28, 2009

(54) METHOD OF MANUFACTURING A PIEZOELECTRIC ELEMENT

(75) Inventors: Setsuya Iwashita, Nirasaki (JP); Koji Ohashi, Chino (JP); Takamitsu Higuchi, Matsumoto (JP)

(73) Assignee: Seiko Epson Corporation (JP)

( * ) Notice: Subject to any disclaimer, the term of this patent is extended or adjusted under 35 U.S.C. 154(b) by 381 days.

(21) Appl. No.: 11/358,893

(22) Filed: Feb. 20, 2006

(65) Prior Publication Data
US 2006/0214542 A1 Sep. 28, 2006

(30) Foreign Application Priority Data
Mar. 25, 2005 (JP) .............................. 2005-089166

(51) Int. Cl.
*H04R 17/00* (2006.01)
(52) U.S. Cl. .................... 29/25.35; 29/831; 29/846; 310/364; 310/366; 427/383.5; 427/419.2
(58) Field of Classification Search .............. 29/25.35, 29/831, 846; 310/311, 328, 363–366; 117/84; 257/295; 252/62.9 R, 62.9 PZ; 427/126.3, 427/383.5, 419.2
See application file for complete search history.

(56) References Cited

U.S. PATENT DOCUMENTS

| | | | | | |
|---|---|---|---|---|---|
| 5,265,315 | A | * | 11/1993 | Hoisington et al. | 29/25.35 |
| 5,449,933 | A | * | 9/1995 | Shindo et al. | 257/295 |
| 5,792,379 | A | * | 8/1998 | Dai et al. | 252/62.9 PZ |
| 6,294,860 | B1 | * | 9/2001 | Shimada et al. | 310/328 |
| 2003/0106489 | A1 | * | 6/2003 | Lung et al. | 117/84 |

FOREIGN PATENT DOCUMENTS

| | | | |
|---|---|---|---|
| JP | 59230398 A | * | 12/1984 |
| JP | 2000-158648 | | 6/2000 |

* cited by examiner

*Primary Examiner*—A. Dexter Tugbang
(74) *Attorney, Agent, or Firm*—Harness, Dickey & Pierce, P.L.C.

(57) ABSTRACT

A method for manufacturing a piezoelectric element includes the steps of forming a first electrode above a substrate, forming, above the first electrode, a piezoelectric layer composed of a piezoelectric material having a perovskite structure, and forming a second electrode above the piezoelectric layer, wherein the step of forming the first electrode includes forming a layer containing nickel, and forming, above the layer containing nickel, a lanthanum nickelate layer that is oriented to a cubic (100).

8 Claims, 5 Drawing Sheets

METHOD OF MANUFACTURING A PIEZOELECTRIC ELEMENT

The entire disclosure of Japanese Patent Application No. 2005-089166, filed Mar. 25, 2005 is expressly incorporated by reference herein.

BACKGROUND

1. Technical Field

The present invention relates to piezoelectric elements and methods for manufacturing the same, ink jet recording heads and ink jet printers.

2. Related Art

Ink jet printers are known as printers that can realize high image quality and high speed printing. In order to improve the characteristics of piezoelectric elements in ink jet recording heads for ink jet printers, it is important to control the crystal orientation of the piezoelectric layers.

As a method to control the crystal orientation, Japanese Laid-open patent application JP-A-2000-158648 describes a control method using a MgO (100) single crystal substrate. However, according to this method, the process for manufacturing an ink jet recording head may become complex.

SUMMARY

In accordance with an advantage of some aspects of the invention, piezoelectric elements that can obtain good piezoelectric characteristics and methods for manufacturing such piezoelectric elements can be provided. In accordance with another aspect of some aspects of the invention, ink jet recording heads and ink jet printers that use the piezoelectric elements described above are provided.

In accordance with an embodiment of the invention, a method for manufacturing a piezoelectric element includes the steps of forming a first electrode above a substrate; forming above the first electrode a piezoelectric layer composed of a piezoelectric material having a perovskite structure; and forming a second electrode above the piezoelectric layer, wherein the step of forming the first electrode includes forming a layer containing nickel, and forming, above the layer containing nickel, a lanthanum nickelate layer that is oriented to a cubic (100).

According to the method for manufacturing a piezoelectric element, a piezoelectric element having good piezoelectric characteristics can be provided, because of the following reasons.

Basically, lanthanum nickelate would likely be self-oriented to (100). However, for example, if the layer containing nickel is not formed, crystals of lanthanum nickelate oriented to (110) may be generated and mixed in the lanthanum nickelate layer, which is not stable. In contrast, according to the method for manufacturing a piezoelectric element in accordance with the present embodiment, the layer containing nickel is formed, and the lanthanum nickelate layer is formed above the layer containing nickel, whereby the lanthanum nickelate layer is stably oriented to (100). In this manner, because the lanthanum nickelate layer is oriented to (100), the piezoelectric layer succeeds the crystal orientation of the lanthanum nickelate layer and is oriented to (100), when the piezoelectric layer is formed above the lanthanum nickelate layer. Accordingly, the piezoelectric element has the piezoelectric layer having a higher piezoelectric constant and exhibits a greater strain to an impressed voltage. In other words, according to the piezoelectric element, much better piezoelectric characteristics can be obtained.

It is noted that, in the descriptions concerning the invention, the term "above" may be used, for example, as "a specific element (hereafter referred to as "A") is formed 'above' another specific element (hereafter referred to as "B")." In this case, the term "above" is assumed to include a case in which A is formed directly on B, and a case in which A is formed above B through another element.

In the method for manufacturing a piezoelectric element in accordance with an aspect of the embodiment, the layer containing nickel may include at least one of nickel and nickel oxide.

In the method for manufacturing a piezoelectric element in accordance with an aspect of the embodiment, during or after the step of forming the lanthanum nickelate layer, at least one of nickel and nickel oxide may be diffused from the layer containing nickel into the lanthanum nickelate layer.

In the method for manufacturing a piezoelectric element in accordance with an aspect of the embodiment, the diffusion of the at least one of nickel and nickel oxide may be conducted by a heat treatment.

In the method for manufacturing a piezoelectric element in accordance with an aspect of the embodiment, the layer containing nickel and the lanthanum nickelate layer may be formed in contact with each other.

In the method for manufacturing a piezoelectric element in accordance with an aspect of the embodiment, the step of forming the first electrode may include forming a low resistivity layer composed of a conductive material having a lower specific resistance compared to lanthanum nickelate.

In the method for manufacturing a piezoelectric element in accordance with an aspect of the embodiment, the conductive material may include at least one of a metal, an oxide of the metal, and an alloy of the metal, and the metal may be at least one of Pt, Ir, Ru, Ag, Au, Cu, Al and Ni.

In the method for manufacturing a piezoelectric element in accordance with an aspect of the embodiment, the lanthanum nickelate layer may be formed above the low resistivity layer.

In the method for manufacturing a piezoelectric element in accordance with an aspect of the embodiment, the lanthanum nickelate layer and the piezoelectric layer may be formed in contact with each other.

In the method for manufacturing a piezoelectric element in accordance with an aspect of the embodiment, the piezoelectric material is composed of a rhombohedral crystal or a mixed crystal of tetragonal and rhombohedral crystals, and may be oriented to (100).

A first piezoelectric element in accordance with an embodiment of the present invention may be obtained by the method for manufacturing a piezoelectric element described above.

A second piezoelectric element in accordance with an embodiment of the invention includes: a substrate, a first electrode formed above the substrate, a piezoelectric layer that is formed above the first electrode and has a perovskite structure, and a second electrode formed above the piezoelectric layer, wherein the first electrode includes a layer containing nickel, and a lanthanum nickelate layer that is formed above the layer containing nickel and is oriented to a cubic (100).

In the piezoelectric element according to an aspect of the invention, the layer containing nickel may include at least one of nickel and nickel oxide.

In the piezoelectric element according to an aspect of the invention, the layer containing nickel may be in contact with the lanthanum nickelate layer.

An ink jet recording head in accordance with an embodiment of the invention has any one of the piezoelectric elements described above.

An ink jet printer in accordance with an embodiment of the invention has the ink jet recording head described above.

DESCRIPTION OF EXEMPLARY EMBODIMENTS

Preferred embodiments of the invention are described below with reference to the accompanying drawings.

1. First Embodiment 1-1. First, a piezoelectric element 10 in accordance with a first embodiment is described.

Figure 1:
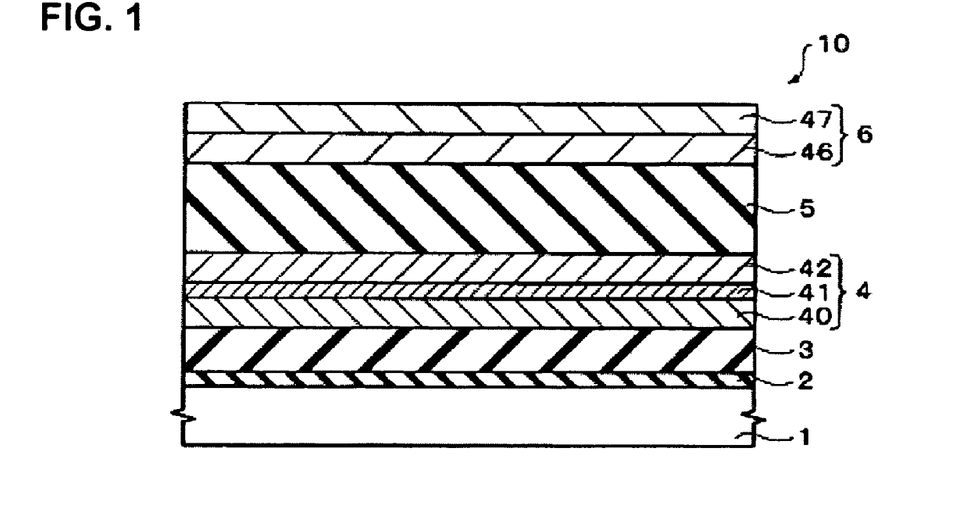
FIG. 1 is a cross-sectional view schematically showing a piezoelectric element in accordance with a first embodiment of the invention.
Figure 2:
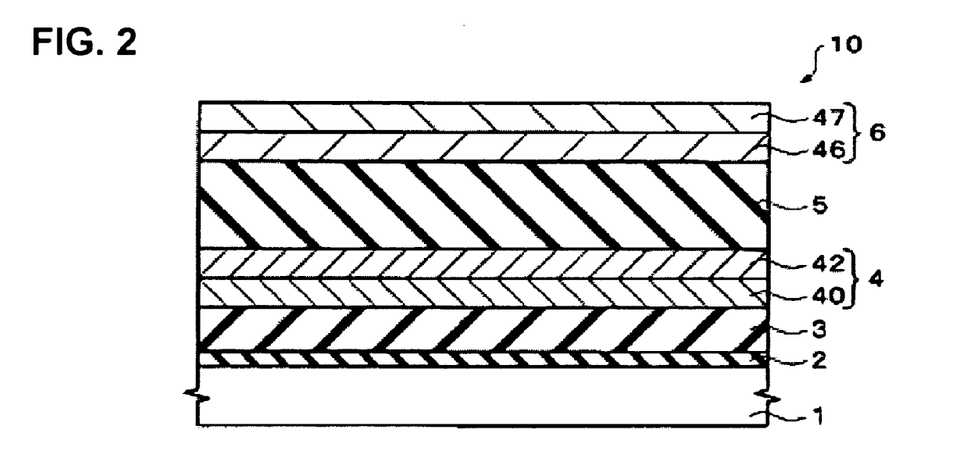
FIG. 2 is a cross-sectional view schematically showing the piezoelectric element in accordance with the first embodiment.

FIG. 1 and FIG. 2 are cross-sectional views of the piezoelectric element 10, respectively. The piezoelectric element 10 includes a substrate 1, a stopper layer 2 formed on the substrate 1, a hard layer 3, formed on the stopper layer 2, a first electrode 4 formed on the hard layer 3, a piezoelectric layer 5 formed on the first electrode 4, and a second electrode 6 formed on the piezoelectric layer 5.

For example, a silicon substrate with a (110) orientation may be used as the substrate 1. For example, a layer of silicon oxide may be used as the stopper layer 2. The stopper layer 2 can function as an etching stopper, for example, in the step of etching the substrate 1 from its back surface side for forming a cavity 521 of an ink jet recording head 50 (see FIG. 7). Also, the stopper layer 2 and the hard layer 3 function as an elastic layer 55 in the ink-jet recording head 50. As the hard layer 3, for example, a layer of yttria stabilized zirconia, cerium oxide, zirconium oxide, or the like can be used.

The first electrode 4 may include a low resistance layer 40, a layer containing nickel (hereafter referred to as a nickel containing layer) 41 formed on the low resistance layer 40, and a lanthanum nickelate layer 42 formed on the nickel containing layer 41. The first electrode 4 is one of electrodes for impressing a voltage to the piezoelectric layer 5. The first electrode 4 may be formed in the same plane configuration as that of, for example, the piezoelectric layer 5.

The low resistance layer 40 is composed of a conductive material having a lower specific resistance, compared to lanthanum nickelate. The conductive material can include at least one of, for example, a metal, an oxide of the metal, an alloy composed of the metal. It is noted that, for example, at least one of Pt, Ir, Ru, Ag, Au, Cu, Al and Ni can be used as the metal. For example, $IrO_2$ and $RuO_2$ may be enumerated as the oxide of the metal. For example, Pt—Ir, Ir—Al, Ir—Ti, Pt—Ir—Al, Pt—Ir—Ti and Pt—Ir—Al—Ti may be enumerated as the alloy composed of the metal. In accordance with the present embodiment, the crystal orientation of the conductive material is not particularly limited, and, for example, can be in a (111) orientation. The film thickness of the low resistance layer 40 may be, for example, about 50 nm-150 nm.

The nickel containing layer 41 may include at least one of nickel and nickel oxide. The nickel containing layer 41 may be formed from, for example, a nickel layer, a nickel oxide layer, and the like. Also, in accordance with the present embodiment, it is possible that the first electrode 4 may not have the nickel containing layer 41. In other words, the first electrode 4 can include only the low resistivity layer 40 and the lanthanum nickelate layer 42 formed on the low resistivity layer 40. It is noted that, in the step of forming the piezoelectric element 10 shown in FIG. 2, the nickel containing layer 41 is formed. Its details are described below. The film thickness of the nickel containing layer 41 may be, for example, about 0 nm-10 nm.

The lanthanum nickelate layer 42 is in contact with the nickel containing layer 41, and also in contact with the piezoelectric layer 5. Lanthanum nickelate composing the lanthanum nickelate layer 42 can be expressed by a chemical formula, $LaNiO_y$ ($2 \leq y \leq 3$). Lanthanum nickelate is oriented to (100). It is noted that the crystal orientation of lanthanum nickelate in the in-plane direction is random. Lanthanum nickelate would likely be self oriented to (100). The film thickness of lanthanum nickelate layer 42 may be, for example, about 10 nm-140 nm.

The piezoelectric layer 5 is composed of a piezoelectric material having a perovskite structure. The piezoelectric layer 5 is in contact with the lanthanum nickelate layer 42. The piezoelectric material composing the piezoelectric layer 5 may preferably be in a rhombohedral crystal or a mixed crystal of tetragonal and rhombohedral crystals, and may preferably be oriented to (100). The piezoelectric layer 5 composed of such a piezoelectric material has a high piezoelectric constant.

The piezoelectric material can be expressed by, for example, a general formula $ABO_3$. It is noted here that A may include Pb, and B may include at least one of Zr and Ti. Further, B may also include at least one of V, Nb and Ta. In this case, the piezoelectric material can include at least one of Si and Ge. More concretely, the piezoelectric material may include at least one of lead zirconate titanate (Pb (Zr, Ti)$O_3$), lead zirconate titanate niobate (Pb (Zr, Ti, Nb) $O_3$), lead lanthanum titanate ((Pb, La) $TiO_3$), lead lanthanum zirconate titanate ((Pb, La) Zr $TiO_3$), lead magnesium niobate titanate (Pb(Mg, Nb) $TiO_3$), lead magnesium niobate zirconate titanate (Pb(Mg, Nb)(Zr, Ti)$O_3$), lead zinc niobate titanate (Pb (Zn, Nb) TiO$_3$), lead scandium niobate titanate (Pb (Sc, Nb) TiO$_3$), lead nickel niobate titanate (Pb(Ni, Nb) TiO$_3$), and lead indium magnesium niobate titanate (Pb (In, Mg, Nb) TiO$_3$).

Also, the piezoelectric material may include at least one of (Ba$_{1-x}$Sr$_x$) TiO$_3$ (0≦x≦0.3), Bi$_4$Ti$_3$O$_{12}$, SrBi$_2$Ta$_2$O$_9$, LiNbO$_3$, LiTaO$_3$ and KNbO$_3$. The film thickness of the piezoelectric layer 5 may be, for example, about 0.4 μm-5 μm.

The second electrode 6 includes a conductive oxide layer 46 and another low resistivity layer (hereafter referred to as a "second low resistivity layer") 47 formed on the conductive oxide layer 46. The second electrode 6 is the other of the electrodes for impressing a voltage to the piezoelectric layer 5. As the second electrode 6 includes the conductive oxide layer 46 and the second low resistivity layer 47, the second electrode 6 and the first electrode 4 are generally placed symmetrical with each other with respect to the piezoelectric layer 5. In other words, the symmetric property of the piezoelectric element 10 can be made better. It is noted that the second electrode 6 can be formed from either the conductive oxide layer 46 or the second low resistivity layer 47. The second electrode 6 may be formed in the same plane configuration as that of the piezoelectric layer 5.

The conductive oxide layer 46 may be composed of conductive oxide having a perovskite structure. The conductive oxide may include, for example, at least one of CaRuO$_3$, SrRuO$_3$, BaRuO$_3$, SrVO$_3$, (La, Sr) MnO$_3$, (La, Sr) CrO$_3$, (La, Sr) CoO$_3$, LaNiO$_y$ (2≦y≦3), and a solid solution composed of at least two of the foregoing materials. The film thickness of the conductive oxide layer 46 may be, for example, about 0 nm-200 nm.

The second low resistivity layer 47 may be composed of, for example, a conductive material with a lower specific resistance compared to the conductive oxide that composes the conductive oxide layer 46. The conductive material may be composed of, for example, the conductive material composing the low resistivity layer 40 described above. The film thickness of the second low resistivity layer 47 may be, for example, about 0 nm-200 nm.

1-2. Next, a method for manufacturing the piezoelectric element 10 in accordance with the present embodiment is described with reference to FIG. 1 and FIG. 2.

First, a silicon substrate with a (110) orientation is prepared as a substrate 1.

Next, a stopper layer 2 is formed on the substrate 1. The stopper layer 2 may be formed by, for example, a thermal oxidation method, a CVD method or the like.

Next, a hard layer 3 is formed on the stopper layer 2. The hard layer 3 may be formed by, for example, a CVD method, a sputtering method, a vacuum evaporation method or the like.

Next, a low resistivity layer 40 is formed on the hard layer 3. As described above, in accordance with the present embodiment, since the crystal orientation of a conductive material that composes the low resistivity layer 40 is not particularly limited, conditions and method for fabricating the low resistivity layer 40 can be optionally selected. The low resistivity layer 40 may be formed by, for example, a sputter method, a vacuum vapor deposition method or the like. Also, the temperature at which the low resistivity layer 40 is formed may be, for example, room temperature to 600° C.

Next, a nickel containing layer 41 is formed on the low resistance layer 40. The nickel containing layer 41 may be formed by, for example, a sputtering method or the like. The forming temperature of the nickel containing layer 41 may be, for example, room temperature to 600° C.

Next, a lanthanum nickelate layer 42 is formed on the nickel containing layer 41. During this step, at least one of nick and nickel oxide can be diffused from the nickel containing layer 41 into the lanthanum nickelate layer 42. Concretely, for example, by setting the substrate temperature at which the lanthanum nickelate layer 42 is formed to 500° C. or higher, at least one of nickel and nickel oxide can be thermally diffused. The lanthanum nickelate layer 42 may be formed by, for example, a sputtering method, a sol-gel method or the like. If the lanthanum nickelate layer 42 is formed by, for example, a RF sputtering method, the RF power may be set to, for example, 500-3 kW. Also, the ratio of oxygen in a mixture of argon and oxygen (O$_2$/(Ar+O$_2$)) may be set to, for example, 0%-50%. By the steps described above, the first electrode 4 is formed.

Alternatively, after the step of forming the lanthanum nickelate layer 42, at least one of nickel and nickel oxide can be diffused from the nickel containing layer 41 into the lanthanum nickelate layer 42. For example, after the lanthanum nickelate layer 42 has been formed, a heat treatment may be conducted. In the heat treatment step, the heat treating temperature may be set to, for example, 500° C.-800° C., whereby at least one of nickel and nickel oxide can be thermally diffused.

As described above, during or after the step of forming the lanthanum nickelate layer 42, at least one of nickel and nickel oxide can be diffused from the nickel containing layer 41 into the lanthanum nickelate layer 42. In other words, nickel (concretely, at least one of nickel and nickel oxide) can be supplied from the nickel containing layer 41 to the lanthanum nickelate layer 42. As a result, the lanthanum nickelate layer 42 can be oriented to (100). This is confirmed by experimental examples to be described below.

As a result of having diffused at least one of nickel and nickel oxide from the nickel containing layer 41 to the lanthanum nickelate layer 42, the nickel containing layer 41 may be left (in the case of FIG. 1) or the nickel containing layer 41 may not be left (in the case of FIG. 2). It is noted that, when the nickel containing layer 41 is to be left, the nickel containing layer 41 may preferably be nickel as nickel has conductivity. The above can be optionally selected by adjusting the film thickness of the nickel containing layer 41, the time for thermal diffusion, the temperature for thermal diffusion and the like.

Next, a piezoelectric layer 5 is formed on the lanthanum nickelate layer 42. The piezoelectric layer 5 may be formed by, for example, a sputtering method, a sol-gel method or the like.

Next, a conductive oxide layer 46 is formed on the piezoelectric layer 5. The conductive oxide layer 46 may be formed by, for example, a sputtering method, a sol-gel method or the like.

Next, a second low resistivity layer 47 is formed on the conductive oxide layer 46. The second low resistivity layer 47 may be formed by, for example, a sputtering method, a vacuum evaporation method or the like. By the steps described above, the second electrode 6 is formed.

By the process described above, the piezoelectric element 10 in accordance with the present embodiment can be formed.

1-3. Next, an experimental example is described.

In the experimental example, the element is formed based on the manufacturing method described above up to formation of the first electrode 4. It is noted that a silicon substrate with a (110) orientation was used as the substrate 1, a laminated layer film of silicon oxide and titanium oxide (TiO$_x$) as the stopper layer 2, a platinum layer as the low resistivity layer 40, and a nickel oxide (NiO$_x$) layer as the nickel containing layer 41. It is noted that the hard layer 3 was not formed. Also, the lanthanum nickelate layer 42 was formed by a RF sputtering method. The RF sputtering method was formed under conditions with the RF power being 1 kW, the substrate temperature being 250° C., and the ratio of $O_2/(Ar+O_2)$ being 10%. The film thickness of each of the layers was as follows. The silicon oxide layer was 1000 nm thick, the titanium oxide layer was 400 nm thick, the low resistance layer 40 was 100 nm thick, the nickel containing layer 41 was 10 nm thick, and the lanthanum nickelate layer 42 was 70 nm thick.

Figure 3:
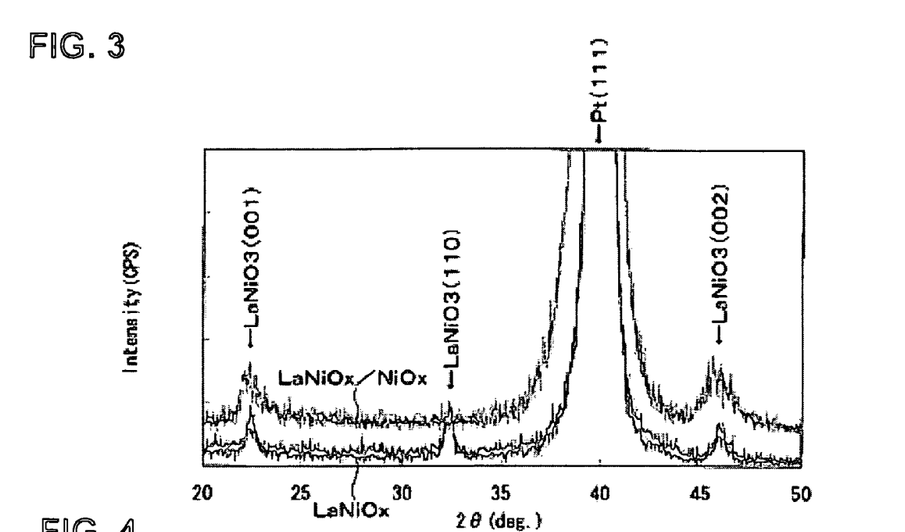
FIG. 3 is a 2θ-θ scanning X-ray diffraction pattern of a lanthanum nickelate layer in accordance with an experimental example.

FIG. 3 is a 2θ-θ scanning X-ray diffraction pattern of the lanthanum nickelate layer 42 in accordance with the experimental example. As a comparison example, an element in which a lanthanum nickelate layer 42 is directly formed on a low resistivity layer 40 without forming a nickel containing layer 41 was formed and subjected to the measurement It is noted that, in FIG. 3, the measurement result of the experimental example is indicated as LaNiOx/NiOx, and the measurement result of the comparison example is indicated as LaNiOx. As shown in FIG. 3, with the comparison example, a peak of lanthanum nickelate (110) was observed. This is because the surface energy of the (110) plane is low and stable. In contrast, with the experimental example, a peak of lanthanum nickelate (110) was not observed, and only peaks that derived from the fact that the lanthanum nickelate was oriented to (100) were observed. It is believed that this happened because, with the experimental example, nickel was supplied to the lanthanum nickelate layer 42 from the nickel containing layer 41, whereby factors of controlling the crystal orientation other than the surface energy were added, which provided an excellent crystal orientation.

Figure 4:
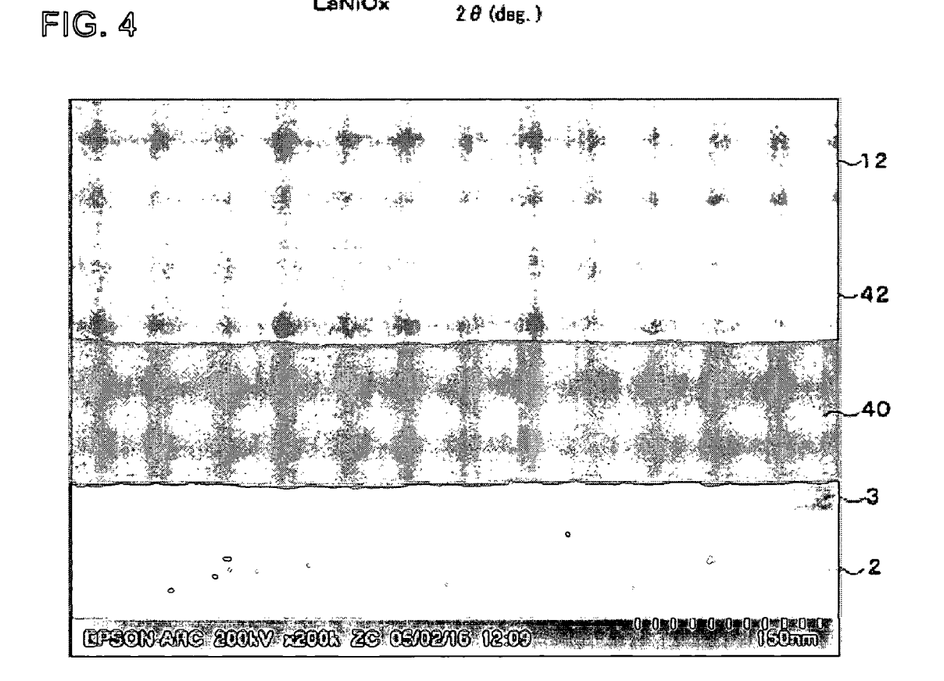
FIG. 4 is a dark field image of the experimental example, which is obtained by a cross sectional TEM.

FIG. 4 is a dark field image of an experimental example, which was obtained by a cross sectional transmission electron microscope (a cross sectional TEM). To make the observation by a cross sectional TEM, an adhesive layer 12 was formed on the lanthanum nickelate layer 42. As shown in FIG. 4, a nickel containing layer 41 was not observed. By this, it was confirmed that nickel oxide was diffused from the nickel containing layer 41 into the lanthanum nickelate layer 42. In other words, it was confirmed that nickel was supplied from the nickel containing layer 41 to the lanthanum nickelate layer 42.

From the result of the experimental example, it was confirmed that, by supplying nickel from the nickel containing layer 41 to the lanthanum nickelate layer 42, the lanthanum nickelate layer 42 was oriented to (100).

1-4. According to the method for manufacturing a piezoelectric element 10 in accordance with the embodiment, the piezoelectric element 10 can be provided with excellent piezoelectric characteristics. The reasons are as follows.

Basically, lanthanum nickelate would likely be self oriented to (100). However, as shown by the comparison example described above, for example, if the lanthanum nickelate layer 42 is formed directly on the low resistivity layer 40 without forming the nickel containing layer 41, crystals of lanthanum nickelate oriented to (110) or the like are mixed in the lanthanum nickelate layer 42. In contrast, by the method for manufacturing the piezoelectric element 10 in accordance with the present embodiment, by forming the nickel containing layer 41, and forming the lanthanum nickelate layer 42 thereon, as described above, the lanthanum nickelate layer 42 is oriented to (100). This does not depend on the crystal orientation of the conductive material that forms the base layer, i.e., the low resistivity layer 40. Due to the fact that the lanthanum nickelate layer 42 is oriented to (100), when the piezoelectric layer 5 is formed on the lanthanum nickelate layer 42, the piezoelectric layer 5 can succeed the crystal orientation of the lanthanum nickelate layer 42, thereby being oriented to (100). As a result, the piezoelectric element 10 can have the piezoelectric layer 5 that has a higher piezoelectric constant, and exhibits a greater deformation to a voltage impressed. In other words, by the piezoelectric element 10 in accordance with the present embodiment, better piezoelectric characteristics can be obtained.

Also, in the piezoelectric element 10 in accordance with the present embodiment, the first electrode 4 has the low resistivity layer 40. The low resistivity layer 40 is composed of a conductive material with a lower resistance compared to lanthanum nickelate. By this, for example, when the case where the first electrode 4 does not have a low resistivity layer 40 and the case where the first electrode 4 has a low resistivity layer 40 are compared to each other, with the first electrodes 4 being in the same configuration, the first electrode 4 has a lower resistance as a whole in the case where the first electrode 4 has the low resistivity layer 40 (in other words, in the case of the present embodiment). Accordingly, the piezoelectric element 10 in accordance with the present embodiment, excellent piezoelectric characteristics can be obtained.

Figure 5:
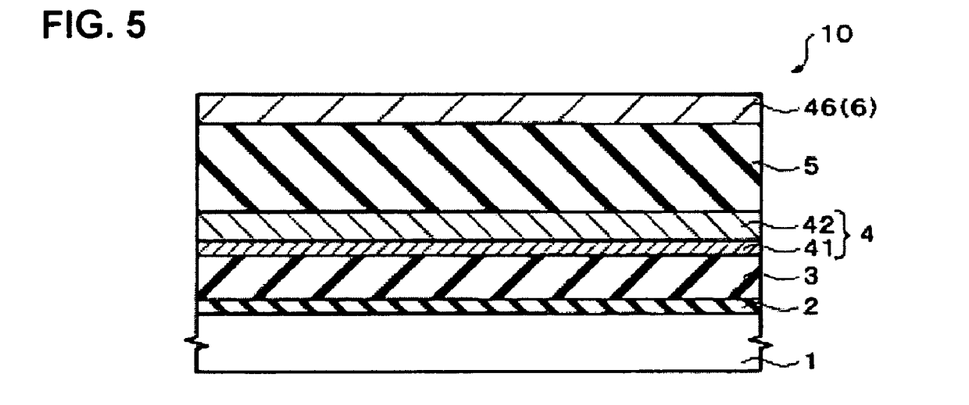
FIG. 5 is a cross-sectional view schematically showing a modified example of the piezoelectric element in accordance with the first embodiment.

1-5. Next, a modified example of the piezoelectric element 10 in accordance with the present embodiment is described with reference to the accompanying drawings. It is noted that features different from those of the piezoelectric element 10 described above and shown in FIG. 1 and FIG. 2 are described, and descriptions of similar features are omitted. FIG. 5 is a cross-sectional view schematically showing an example of the modified example of the piezoelectric element 10 shown in FIG. 1, and FIG. 6 is a cross-sectional view schematically showing an example of the modified example of the piezoelectric element 10 shown in FIG. 2.

Figure 6:
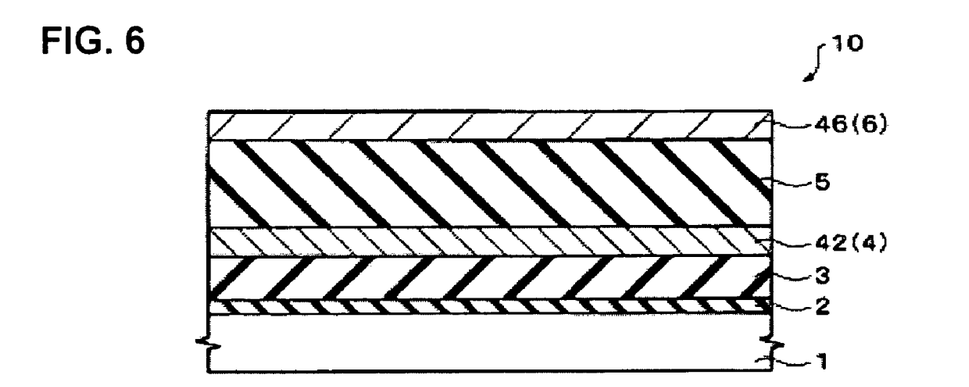
FIG. 6 is a cross-sectional view schematically showing a modified example of the piezoelectric element in accordance with the first embodiment.

For example, as shown in FIG. 5 and FIG. 6, it is possible that a first electrode 4 does not have a low resistivity layer 40. In other words, in the example shown in FIG. 5, the first electrode 4 may be composed of a nickel containing layer 41 and a lanthanum nickelate layer 42. Also, in the example shown in FIG. 6, it is possible that a first electrode 4 is composed of a lanthanum nickelate layer 42 alone. It is noted that, in the process of forming the piezoelectric element 10 shown in FIG. 6, a nickel containing layer 41 is formed.

Also, for example, as shown in FIG. 5 and FIG. 6, a second electrode 6 may be composed of a conductive oxide layer 46 alone. Also, for example, although not shown, the second electrode 6 may be composed of a second low resistivity layer 47 alone. In these cases, the second electrode 6 and the first electrode 4 can be provided generally symmetrical with each other with respect to a piezoelectric layer 5.

It is noted that the modified examples described above represent merely examples, and the invention is not limited to these modified examples. For example, the lamination order and the number of the layers laminated can be optionally changed.

Figure 7:
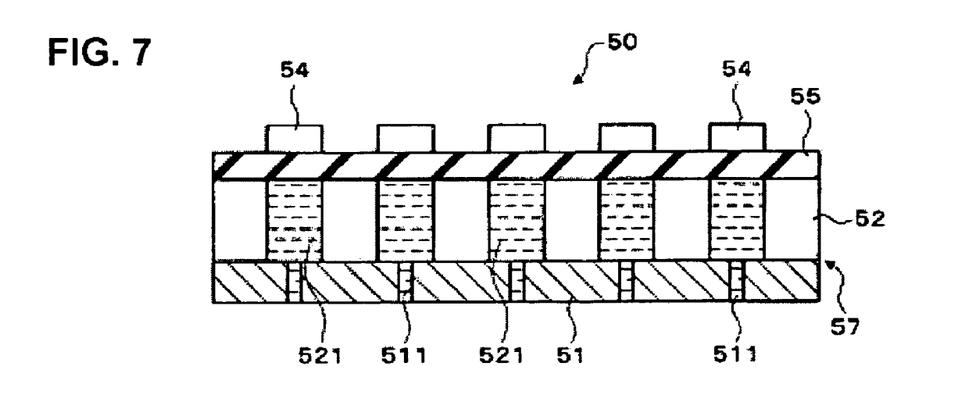
FIG. 7 is a schematic structural diagram of an ink jet recording head in accordance with a second embodiment of the invention.
Figure 8:
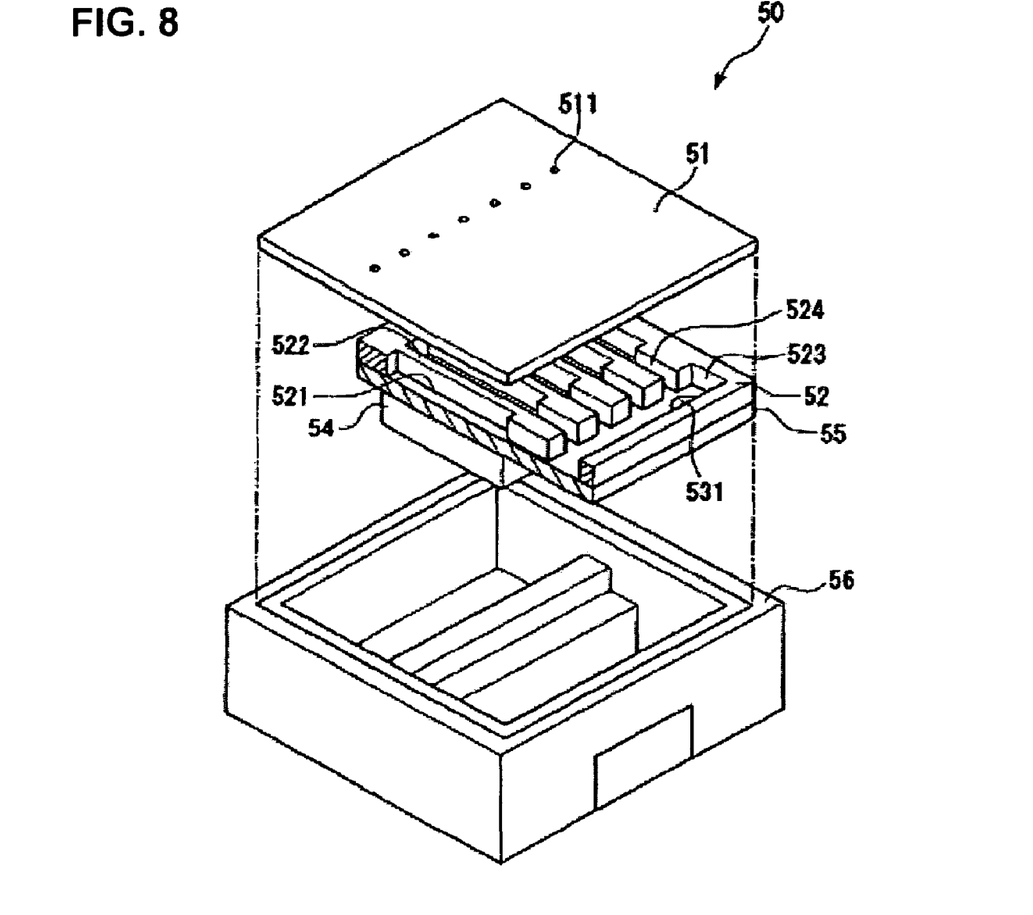
FIG. 8 is a schematic exploded perspective view of the ink jet recording head in accordance with the second embodiment.

2. Second Embodiment 2-1. Next, an ink jet recording head in accordance with an embodiment having a piezoelectric element 10 of the first embodiment is described. FIG. 7 is a side cross-sectional view schematically showing a structure of an ink jet recording head in accordance with the present embodiment, and FIG. 8 is an exploded perspective view of the ink jet recording head. It is noted that FIG. 8 shows the ink jet recording head upside down with respect to a state in which it is normally used.

The ink jet recording head (hereafter also referred to as the "head") 50 is equipped with a head main body 57 and piezoelectric sections 54 provided above the head main body 57, as shown in FIG. 7. It is noted that each of the piezoelectric sections 54 shown in FIG. 7 corresponds to a section having the first electrode 4, the piezoelectric layer 5 and the second electrode 6 of the piezoelectric element 10 in accordance with the first embodiment.

Also, the stopper layer 2 and the hard layer 3 in the piezoelectric element 10 in accordance with the first embodiment correspond to an elastic layer 55 in FIG. 7. Also, the substrate 1 composes a main portion of the head main body 57, in FIG. 7.

The head 50 is equipped with a nozzle plate 51, an ink chamber substrate 52, an elastic layer 55, and piezoelectric elements (vibration sources) 54 that are bonded to the elastic layer 55, which are housed in a base substrate 56, as shown in FIG. 8. The head 50 forms an on-demand type piezoelectric jet head.

The nozzle plate 51 is formed from, for example, a rolled plate of stain less steel or the like, and includes multiple nozzles 511 formed in a row for jetting ink droplets. The pitch of the nozzles 511 may be appropriately set according to the printing resolution.

The ink chamber substrate 52 is fixedly bonded (affixed) to the nozzle plate 51. The ink chamber substrate 52 is formed with the substrate 1 described above (see FIG. 1, for example). The ink chamber substrate 52 has a plurality of cavities 521, a reservoir 523, and supply ports 524, which are defined by the nozzle plate 51, side walls (partition walls) 522 and the elastic layer 55. The reservoir 523 temporarily reserves ink that is supplied from an ink cartridge 631 (see FIG. 11). The ink is supplied from the reservoir 523 to the respective cavities 521 through the supply ports 524.

Each of the cavities 521 is provided, corresponding to each of the corresponding nozzles 511, as shown in FIG. 7 and FIG. 8. The cavity 521 has a volume that is variable by vibrations of the elastic layer 55. The cavity 521 is formed to eject ink by the volume change.

As a base material for obtaining the ink chamber substrate 52 (see FIG. 1, for example), for example, a silicon single-crystal substrate with a (110) orientation is used. Because the silicon single-crystal substrate with a (110) orientation is suitable for anisotropic etching, the ink chamber substrate 52 can be readily and securely formed.

The elastic layer 55 is disposed on the ink chamber substrate 52 on the opposite side of the nozzle plate 51. Also, a plurality of piezoelectric sections 54 are provided on the elastic layer 55 on the opposite side of the ink chamber substrate 52. A communication hole 531 that penetrates the elastic layer 55 in its thickness direction is formed in the elastic layer 55 at a predetermined position. Ink is supplied from an ink cartridge 631 to the reservoir 523 through the communication hole 531.

Each of the piezoelectric sections 54 is electrically connected to a piezoelectric element driving circuit to be described below, and is structured to operate (vibrate, deform) based on signals provided by the piezoelectric element driving circuit. In other words, each of the piezoelectric sections 54 functions as a vibration source (piezoelectric element). The elastic layer 55 vibrates (deforms) by vibration (deformation) of the piezoelectric section 54, and functions to instantaneously increase the inner pressure of the cavity 521.

The base substrate 56 is formed from, for example, any one of various resin materials, any one of metal materials, or the like. The ink chamber substrate 52 is affixed to and supported by the base substrate 56, as shown in FIG. 8.

Figure 9:
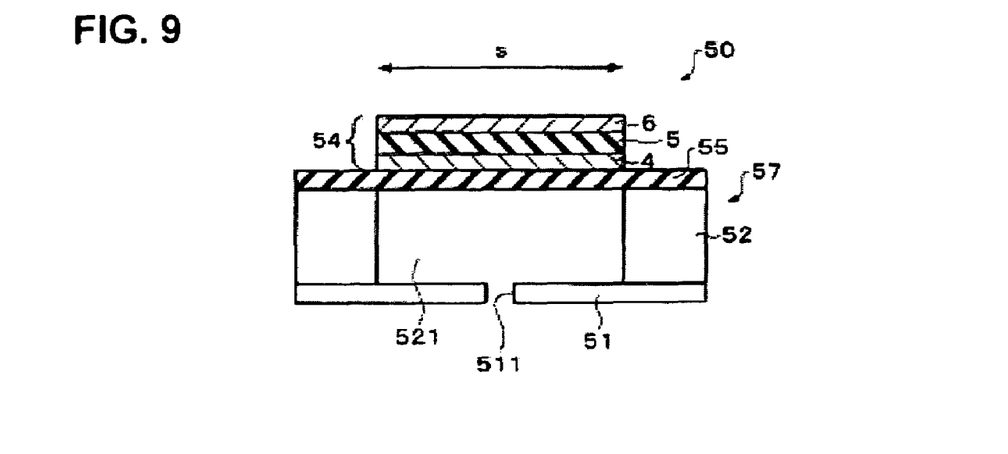
FIG. 9 is a view for describing operations of an ink jet recording head.

2-2. Next, operations of the ink jet recording head 50 in accordance with the present embodiment are described. In the head 50 in accordance with the present embodiment, in a state in which a predetermined jetting signal is not inputted through the piezoelectric element driving circuit, in other words, in a state in which no voltage is applied across the first electrode 4 and the second electrode 6 of the piezoelectric section 54, no deformation occurs in the piezoelectric layer 5, as shown in FIG. 9. Therefore, no strain occurs in the elastic layer 55, and no volume change occurs in the cavity 521. Accordingly, no ink droplet is discharged from the nozzle 511.

Figure 10:
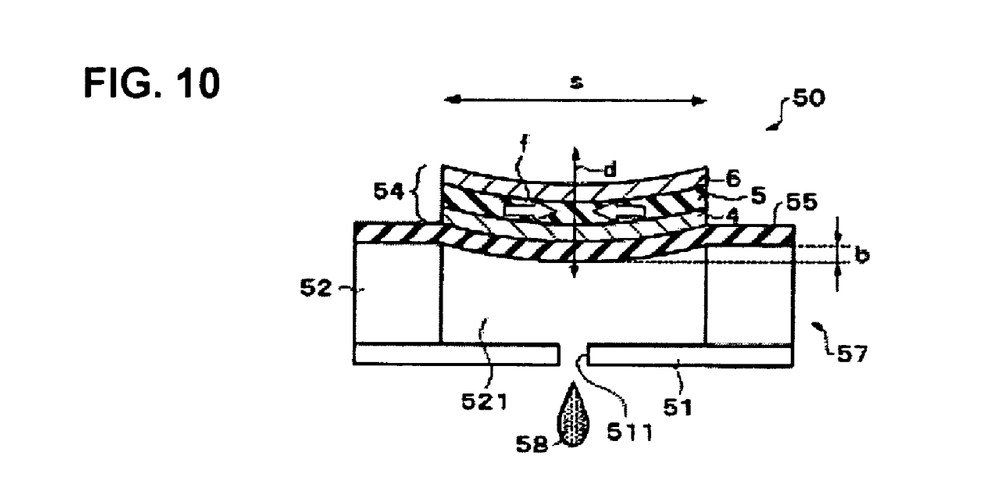
FIG. 10 is a view for describing operations of the ink jet recording head.

On the other hand, in a state in which a predetermined jetting signal is inputted through the piezoelectric element driving circuit, in other words, in a state in which a predetermined voltage is impressed across the first electrode 4 and the second electrode 6 of the piezoelectric section 54, a deflection deformation occurs in the piezoelectric layer 5 in its minor axis direction (in a direction indicated by an arrow s shown in FIG. 10). By this, the elastic layer 55 flexes, thereby causing a change in the volume of the cavity 521. At this moment, the pressure within the cavity 521 instantaneously increases, and an ink droplet 58 is discharged from the nozzle 511.

In other words, when the voltage is impressed, the crystal lattice of the piezoelectric layer 5 is extended in a direction perpendicular to its surface (in a direction indicated by an arrow d shown in FIG. 10), but at the same time compressed in a direction along the surface. In this state, a tensile stress f works in-plane in the piezoelectric layer 5. Therefore, this tensile stress f bends and flexes the elastic layer 55. The larger the amount of displacement (in an absolute value) of the piezoelectric layer 5 in the direction of the minor axis of the cavity 521, the more the amount of flex of the elastic layer 55 becomes, and the more effectively an ink droplet can be discharged.

When an ejection of ink has been completed, the piezoelectric element driving circuit stops application of the voltage across the first electrode 4 and the second electrode 6. By this, the piezoelectric section 54 returns to its original shape, shown in FIG. 9, and the volume of the cavity 521 increases. It is noted that, at this moment, a pressure (pressure in a positive direction) works on the ink in a direction from the ink cartridge 631 toward the nozzle 511. For this reason, air is prevented from entering the cavity 521 from the nozzle 511, and an amount of ink matching with the jetting amount of ink is supplied from the ink cartridge 631 through the reservoir 523 to the cavity 521.

In this manner, by inputting jetting signals successively through the piezoelectric element driving circuit to the piezoelectric sections 54 at positions where ink droplets are to be jetted, arbitrary (desired) characters and figures can be printed.

2-3. Next, an example of a method for manufacturing the ink jet recording head 50 in accordance with the present embodiment is described.

First, a base material that becomes an ink chamber substrate 52, in other words, a substrate 1 composed of a silicon single-crystal substrate with a (110) orientation, is prepared. Then, as shown in FIG. 1, for example, layers for a stopper layer 2, a hard layer 3, a first electrode 4, a piezoelectric layer 5 and a second electrode 6 are successively formed over the substrate 1.

Next, the second electrode 6, the piezoelectric layer 5 and the first electrode 4 are patterned in a manner to correspond to each of the cavities 521, as shown in FIG. 9, thereby forming piezoelectric sections 54 in the number corresponding to the number of the cavities 521, as shown in FIG. 7.

Next, the base material (substrate 1) that becomes an ink chamber plate 52 is patterned, thereby forming concave sections that become the cavities 521 at positions corresponding to the piezoelectric sections 54, and concave sections that become a reservoir 523 and supply ports 524 at predetermined positions.

In the present embodiment, because a silicon substrate with a (110) orientation is used as the base material (substrate 1), a wet etching (anisotropic etching) using a highly concentrated alkaline solution is preferably used. In the case of wet etching with a highly concentrated alkaline solution, the stopper layer 2 can function as an etching stopper, as described above. Therefore the ink chamber plate 52 can be more readily formed.

In this manner, the base material (substrate 1) is removed by etching in its thickness direction to the extent that the elastic layer 55 is exposed, thereby forming the ink chamber substrate 52. It is noted that, in this instance, portions that remain without being etched become side walls 522.

Next, a nozzle plate 51 formed with a plurality of nozzles 511 is bonded such that each of the nozzles 511 is aligned to correspond to each of the concave sections that become the respective cavities 521. By this, the plurality of cavities 521, the reservoir 523 and the plurality of supply ports 524 are formed. For bonding the nozzle plate 51, for example, a bonding method using adhesive, a fusing method, or the like can be used. Next, the ink chamber substrate 52 is attached to the base substrate 56.

By the process described above, the ink jet recording head 50 in accordance with the present embodiment can be manufactured.

2-4. In the inkjet recording head 50 in accordance with the present embodiment, the piezoelectric layer 5 of the piezoelectric section 54 has a high piezoelectric constant ($d_{3\,1}$) and exhibits a greater strain to a voltage impressed, as described above in conjunction with the first embodiment. In other words, the piezoelectric section 54 has excellent piezoelectric characteristics. Accordingly, the amount of deflection of the elastic layer 55 can become greater, and the ink droplet can be discharged more efficiently. It is noted here that the term "efficiently" implies that an ink droplet in the same amount can be jetted by a lower voltage. In other words, the driving circuit can be simplified, and at the same time, the power consumption can be reduced, such that the nozzles 511 can be formed at a pitch with a higher density. Accordingly, a high density printing and a high-speed printing become possible. Furthermore, the length of the major axis of the cavity 521 can be shortened, such that the entire head can be miniaturized.

Figure 11:
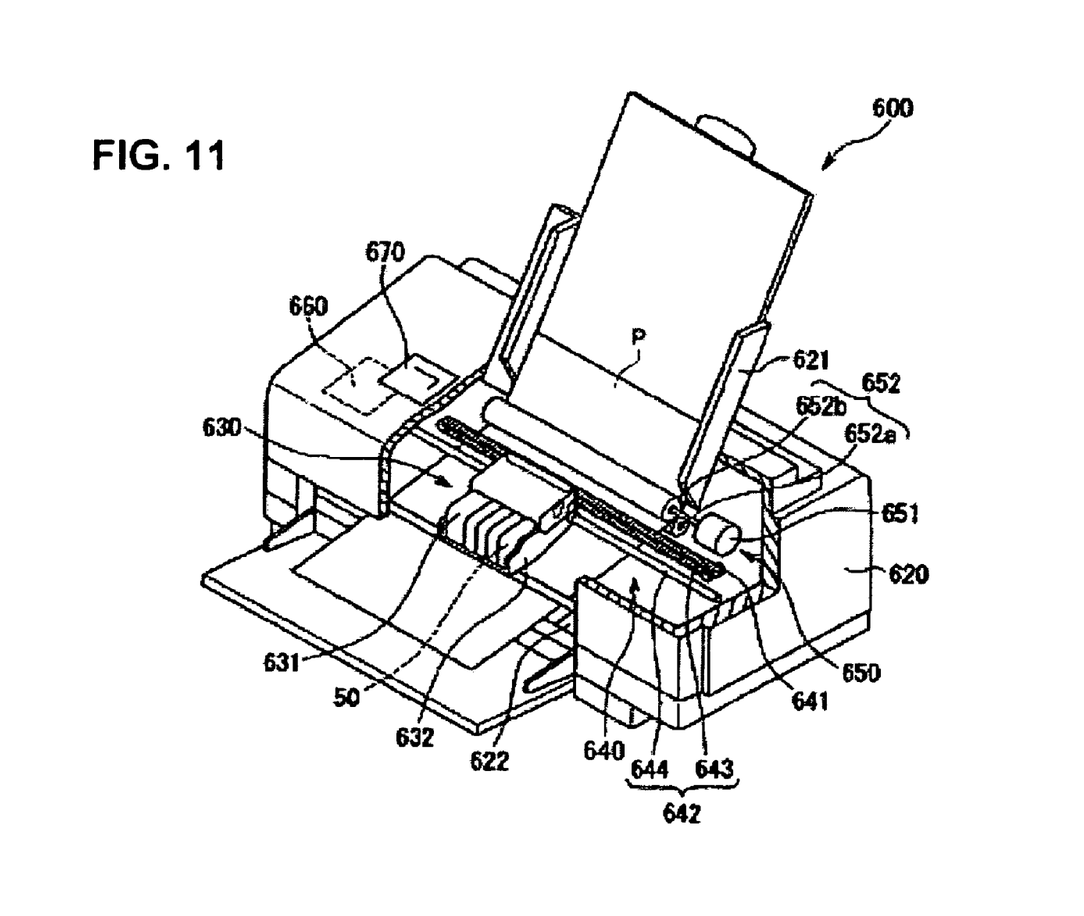
FIG. 11 is a view schematically showing a structure of an ink jet printer in accordance with a third embodiment of the invention.

3. Third Embodiment 3-1. Next, an ink jet printer in accordance with an embodiment of the invention equipped with an ink jet recording head 50 of the second embodiment is described. FIG. 11 is a view schematically showing a structure of an ink jet printer 600 in accordance with the present embodiment. The ink jet printer 600 can function as a printer capable of printing on paper or the like. It is noted that, an upper side in FIG. 11 refers to an "upper section" and a lower side therein refers to a "lower section" in the following descriptions.

The ink jet printer 600 is equipped with an apparatus main body 620, a tray 621 for holding recording paper P in an upper rear section thereof, a discharge port 622 for discharging the recording paper P to a lower front section thereof, and an operation panel 670 on an upper surface thereof.

The apparatus main body 620 is provided on its interior mainly with a printing device 640 having a head unit 630 that can be reciprocated, a paper feeding device 650 for feeding recording paper P one by one into the printing device 640, and a control section 660 for controlling the printing device 640 and the paper feeding device 650.

The printing device 640 is equipped with the head unit 630, a carriage motor 641 that is a driving source for the head unit 630, and a reciprocating mechanism 642 that receives rotations of the carriage motor 641 to reciprocate the head unit 630.

The head unit 630 includes the ink jet recording head 50 equipped with multiple nozzles 511 in its lower section, ink cartridges 631 that supply inks to the ink jet recording head 50, and a carriage 632 on which the ink jet recording head 50 and the ink cartridges 631 are mounted.

The reciprocating mechanism 642 includes a carriage guide shaft 644 with its both ends being supported by a frame (not shown), and a timing belt 643 that extends in parallel with the carriage guide shaft 644. The carriage 632 is freely reciprocally supported by the carriage guide shaft 644, and affixed to a portion of the timing belt 643. By operations of the carriage motor 641, the timing belt 643 is moved in a positive or reverse direction through pulleys, and the head unit 630 reciprocally moves, guided by the carriage guide shaft 644. During these reciprocal movements, the ink is jetted from the ink jet recording head 50, to be printed on the recording paper P.

The paper feeding device 650 includes a paper feeding motor 651 as its driving source and a paper feeding roller 652 that is rotated by operations of the paper feeding motor 651. The paper feeding roller 652 is composed of a follower roller 652a and a driving roller 652b that are disposed up and down and opposite to each other with a feeding path of the recording paper P (i.e., the recording paper P) being interposed between the two, and the driving roller 652b is coupled to the paper feeding motor 651.

3-2. Because the ink jet printer 600 in accordance with the present embodiment is equipped with the ink jet recording head 50 with high performance, which is capable of arranging nozzles at a higher density, as described above in conjunction with the second embodiment, a high density printing and a high-speed printing become possible.

It is noted that the ink jet printer 600 in accordance with the present embodiment can also be used as a droplet discharge device that is used for industrial purposes. In this case, as ink (liquid material) to be jetted, a variety of functional materials may be used with their viscosity being appropriately adjusted by solvent, dispersion medium or the like.

The embodiments of the invention are described above in detail. However, those skilled in the art should readily understand that many modifications can be made without substantially departing from the novel matter and effects of the invention. Accordingly, those modified examples are also included in the scope of the invention. For example, the piezoelectric elements in accordance with the present invention are applicable not only to the devices described above, but also to a variety of other devices.

What is claimed is:

1. A method for manufacturing a piezoelectric element, comprising:
    forming a first electrode including:
        forming a layer containing nickel oxide above a substrate;
        forming a lanthanum nickelate layer above the layer containing nickel oxide; and
        diffusing nickel oxide from the layer containing nickel oxide into the lanthanum nickelate layer;
    forming a piezoelectric layer having a perovskite structure above the lanthanum nickelate layer; and
    forming a second electrode above the piezoelectric layer.

2. A method for manufacturing a piezoelectric element according to claim 1, wherein the nickel oxide is diffused by a heat treatment.

3. A method for manufacturing a piezoelectric element according to claim 1, wherein the layer containing nickel oxide and the lanthanum nickelate layer are formed in contact with each other.

4. A method for manufacturing a piezoelectric element according to claim 1, wherein the step of forming the first electrode includes forming a low resistivity layer composed of a conductive material having a lower specific resistance compared to the lanthanum nickelate layer.

5. A method for manufacturing a piezoelectric element according to claim 4, wherein the conductive material includes at least one of a metal, an oxide of the metal; wherein an alloy of the metal, and the metal is at least one of Pt, Ir, Ru, Ag, Au, Cu, Al and Ni.

6. A method for manufacturing a piezoelectric element according to claim 4, wherein the lanthanum nickelate layer is formed above the low resistance layer.

7. A method for manufacturing a piezoelectric element according to claim 6, wherein the lanthanum nickelate layer and the piezoelectric layer are formed in contact with each other.

8. A method for manufacturing a piezoelectric element according to claim 1, wherein the piezoelectric material is composed of a rhombohedral crystal or a mixed crystal of tetragonal and rhombohedral crystals, and is oriented to (100).

* * * * *